United States Patent [19]

Thornton

[11] Patent Number: 5,038,185

[45] Date of Patent: Aug. 6, 1991

[54] STRUCTURALLY CONSISTENT SURFACE SKIMMING HETERO-TRANSVERSE JUNCTION LASERS AND LATERAL HETEROJUNCTION BIPOLAR TRANSISTORS

[75] Inventor: Robert L. Thornton, East Palo Alto, Calif.

[73] Assignee: Xerox Corporation, Stamford, Conn.

[21] Appl. No.: 443,999

[22] Filed: Nov. 30, 1989

[51] Int. Cl.$^5$ ............................................ H01L 33/00
[52] U.S. Cl. ....................................... 357/17; 357/16; 372/47; 372/45; 372/50; 372/43; 372/44; 372/46
[58] Field of Search .................. 357/17, 16; 350/96.12; 372/45, 43, 50, 102, 44, 46, 47

[56] References Cited

U.S. PATENT DOCUMENTS

| | | | |
|---|---|---|---|
| 4,399,542 | 8/1983 | Kawanishi | 372/47 |
| 4,476,563 | 10/1984 | Van Ruyven | 372/50 |
| 4,615,032 | 9/1986 | Holbrook et al. | 372/45 |
| 4,630,083 | 12/1986 | Yamakoshi | 357/17 |
| 4,819,245 | 4/1989 | Morimoto et al. | 372/45 X |
| 4,888,624 | 12/1989 | Johnson, Jr. et al. | 357/17 X |
| 4,893,313 | 1/1990 | Hatakoshi et al. | 357/17 X |
| 4,896,328 | 1/1990 | Sekiguchi et al. | 357/17 X |

FOREIGN PATENT DOCUMENTS

| | | | |
|---|---|---|---|
| 57-28383 | 2/1982 | Japan | 357/47 |
| 58-28887 | 2/1983 | Japan | |
| 58-197789 | 11/1983 | Japan | |
| 58-225682 | 12/1983 | Japan | |
| 62-158382 | 7/1987 | Japan | |
| 64-49294 | 2/1989 | Japan | |

OTHER PUBLICATIONS

R. L. Thornton, et al., "Unified Planar Process for Fabricating Heterojunction Bipolar Transistors and Buried Heterostructure Lasers Utilizing Impurity Induced Disordering", Applied Physics Letters, vol. 53, No. 26, Dec. 26, 1988, pp. 2669–2671.

R. L., Thornton, et al., "Demonstration and Properties of a Planar Heterojunction Bipolar Transistor with Lateral Current Flow", IEEE Transactions on Electron Devices, vol. 36, No. 10, Oct. 1989, pp. 2156–2164.

G. A. Vawter, "Monolithically Integrated Transverse-Junction-Stripe Laser with an External Waveguide in GaAs/AlGaAs", IEEE Journal of Quantum Electronics, vol. 25, No. 2, Feb. 1989, pp. 154–162.

N. Ogasawara, et al., "Second Harmonic Generation in an AlGaAs Double-Heterostructure Laser", Japanese Journal of Applied Physics, vol. 28, No. 8, Aug. 1987, pp. 1386–1387.

K. Shimoyama, et al., "CW Operation and Extremely Low Capacitance of TJ-BH MQW Laser Diodes Fabricated by Entire MOVPE", Japanese Journal of Applied Physics, vol. 27, No. 12, Dec. 1988, pp. L2417–L2419.

S. H. Macobmer, "Surface-Emitting Distributed Feedback Semiconductor Laser", Applied Physics Letters, vol. 51, No. 7, Aug. 17, 1987, pp. 472–474.

Primary Examiner—William Mintel

[57] ABSTRACT

This disclosure pertains to compound semiconductor, such as AlGaAs, surface skimming hetero-transverse junction (HTJ) lasers and improved heterojunction bipolar transistors (L-HBTs). These lasers and transistors are structurally consistent with each other, so they can be fabricated in the same set of epitaxial layers for integrated optoelectronic applications. The surface skimming characteristic of the HTJ lasers provided by this invention enables them to be configured relatively easily, without requiring any epitaxial regrowth, to operate as DFB lasers in axial or surface emitting configurations and to function as harmonic generators. Single and multiple base channel L-HBT transistors, as well as structurally corresponding single and multiple quantum well surface skimming HJT lasers are disclosed.

11 Claims, 9 Drawing Sheets

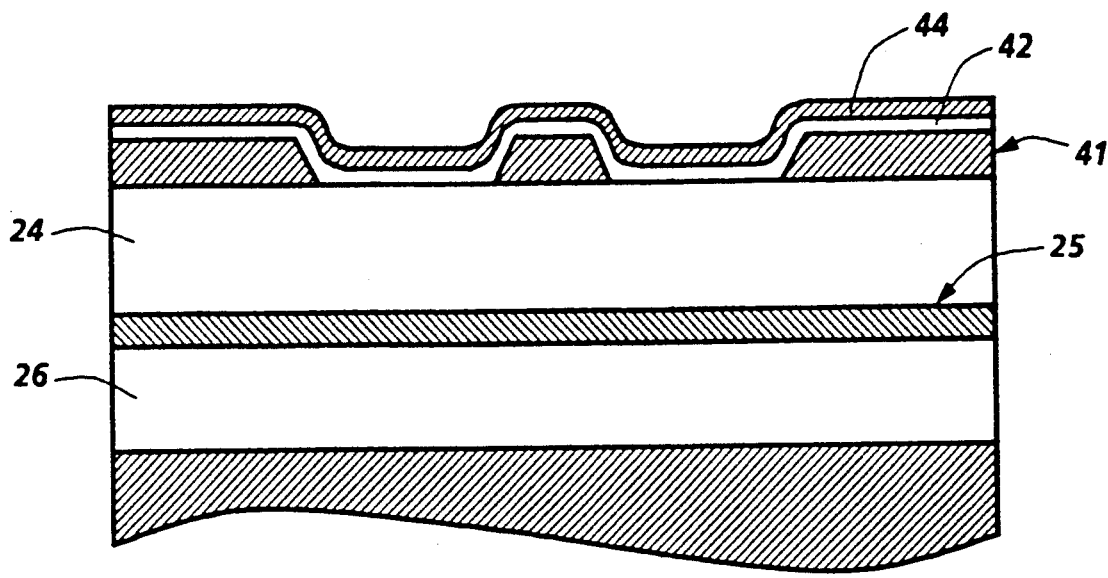
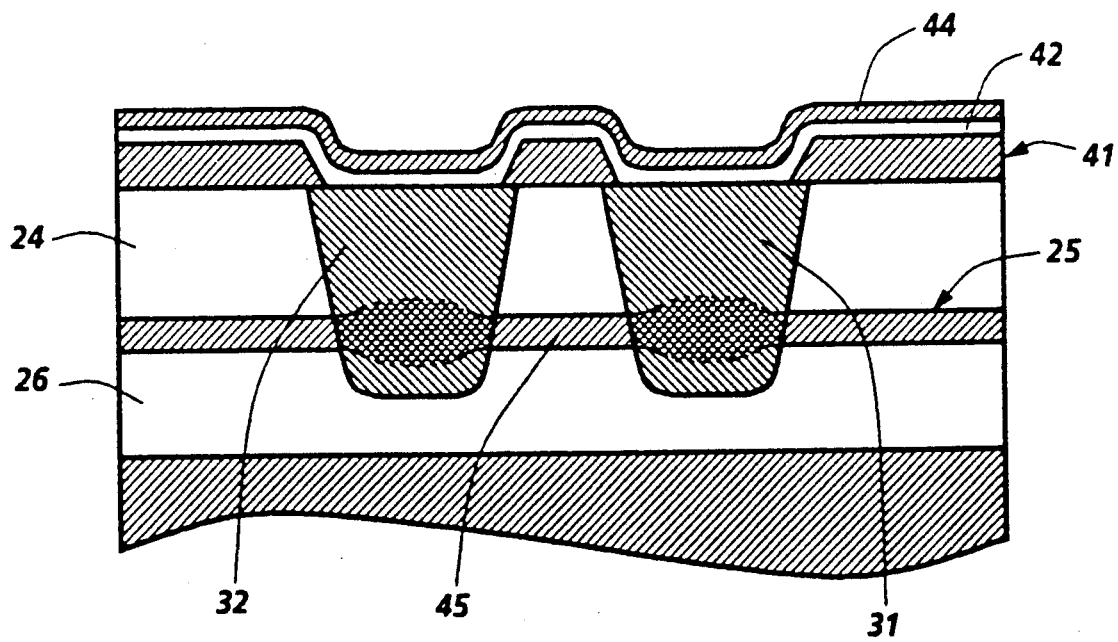
Fig. 2

Fg. 6

STRUCTURALLY CONSISTENT SURFACE SKIMMING HETERO-TRANSVERSE JUNCTION LASERS AND LATERAL HETEROJUNCTION BIPOLAR TRANSISTORS

FIELD OF THE INVENTION

This invention relates to surface skimming, buried heterostructure III-V and II-VI compound semiconductor lasers and, more particularly, to buried heterostructure compound semiconductor devices which can be configured to operate either as surface skimming hetero-transverse junction (HTJ) lasers or as lateral heterojunction bipolar transistors (L-HBT's). As a matter of definition, the waveguided mode or modes of a "surface skimming" laser have substantial optical intensity at the outermost surface of the semiconductor structure, so the semiconductor/air interface is an integral part of the optical waveguide. Furthermore, while much of the following discussion is directed toward the well known AlGaAs III-V compound semiconductor devices, it is to be understood that "compound semiconductor" devices more generally refers to semiconductor devices composed of III-V or II-VI compounds.

BACKGROUND OF THE INVENTION

Commonly assigned U.S. Pat. No. 4,987,648 of R. L. Thornton, which issued Jan. 22, 1991 on "Lateral Heterojunction Bipolar Transistor (LHBT) and Suitability Thereof as Hetero Transverse Junction (HTJ) Laser," describes the use of impurity induced disordering (IID) for forming the p-n junctions of planar buried heterostructure compound semiconductor devices, including "dual function HTJ laser/L-HBT transistor devices" (i.e., devices which can be biased for operation either as HTJ lasers or as L-HBT transistors). Buried heterostructure devices of that general type are preferred because their internal structures are planar and are fabricated entirely by diffusion, without any intermediate etching steps or any other interruptions requiring epitaxial regrowth. The above-identified Thornton'648 patent hereby is incorporated by reference, together with the following related articles: R. L. Thornton et al., "Unified Planar Process for Fabricating Heterjunction Bipolar Transistors and Buried Heterostructure Lasers Utilizing Impurity Induced Disordering" *Applied Physics Letters*, Vol. 53, No. 26, Dec. 26, 1988, pp. 2669-2671; and R. L. Thornton et al., "Demonstration and Properties of a Planar Heterojunction Bipolar Transistor with Lateral Current Flow," *IEEE Transcations on Electron Devices*, Vol. 36, No. 10, October 1989, pp. 2156-2164.

Heretofore the accepted practice has been to bury the active region of a HTJ laser sufficiently far below the outer surface of the semiconductor to ensure that the evanescent optical field of the laser decays to a negligibly low intensity level before it reaches the outer surface of the semiconductor. For example, the active regions of AlGaAs HTJ lasers characteristically have been buried at depths in excess of about 1 $\mu$m for effectively isolating their evanescent optical fields from their usual GaAs capping layers and from the metallizations that are normally provided for making external electrical connections to them. This practice has been followed, even though it was recognized that the performance of the structurally corresponding L-HBT transistor was adversely affected by burying its active base channel so deeply. More particularly, it was known that the width of the base channel of such a transistor could be significantly reduced and more precisely controlled, while maintaining a given photolithographic feature size, by forming the active base channel closer to the outer surface of the multilayer heterostructure. Furthermore, conventional HBT technology provided convincing evidence that L-HBT transistors having narrower base channels would have higher current gain and improved high frequency performance. Nevertheless, until now, the depth to which the active base regions of dual function HTJ laser/L-HBT devices have been buried has been governed by the assumption that the evanescent optical field intensity of the waveguided modes of the laser configuration of such a device should be neglibible at the surface of the device.

SUMMARY THE INVENTION

In accordance with the present invention, it has been found that HTJ lasers can operate satisfactorily with waveguided modes of substantial optical intensity at the outer surface of the multilayer heterostructures in which they are fabricated, thereby permitting such lasers and L-HBT transistors having base channels of reduced length to be fabricated in the same set of epitaxial layers. The surface skimming characteristic of the HTJ lasers provided by this invention enables them to be configured relatively easily, without requiring any epitaxial regrowth, to operate as DFB lasers in axial or surface emitting configurations and to function as harmonic generators. Single and multiple base channel L-HBT transistors, as well as structurally corresponding single and multiple quantum well surface skimming HJT lasers, can be constructed in accordance with this invention.

BRIEF DESCRIPTION OF THE DRAWINGS

Further objects and advantages of this invention will become apparent when the following detailed description is read in conjunction with the attached drawings, in which:

FIG. 2 schematically illustrates some of the recommended steps for fabricating a HTJ laser/L-HBT device of the type shown in FIG. 1;

DETAILED DESCRIPTION OF THE ILLUSTRATED EMBODIMENTS

While the invention is described in some detail hereinbelow with specific reference to certain embodiments and certain applications, it is to be understood that there is no intent to limit it to those particular embodiments or applications. On the contrary, the intent is to cover all modifications, alternatives and equivalents following within the spirit and scope of the invention as defined by the appended claims.

Figure 1:
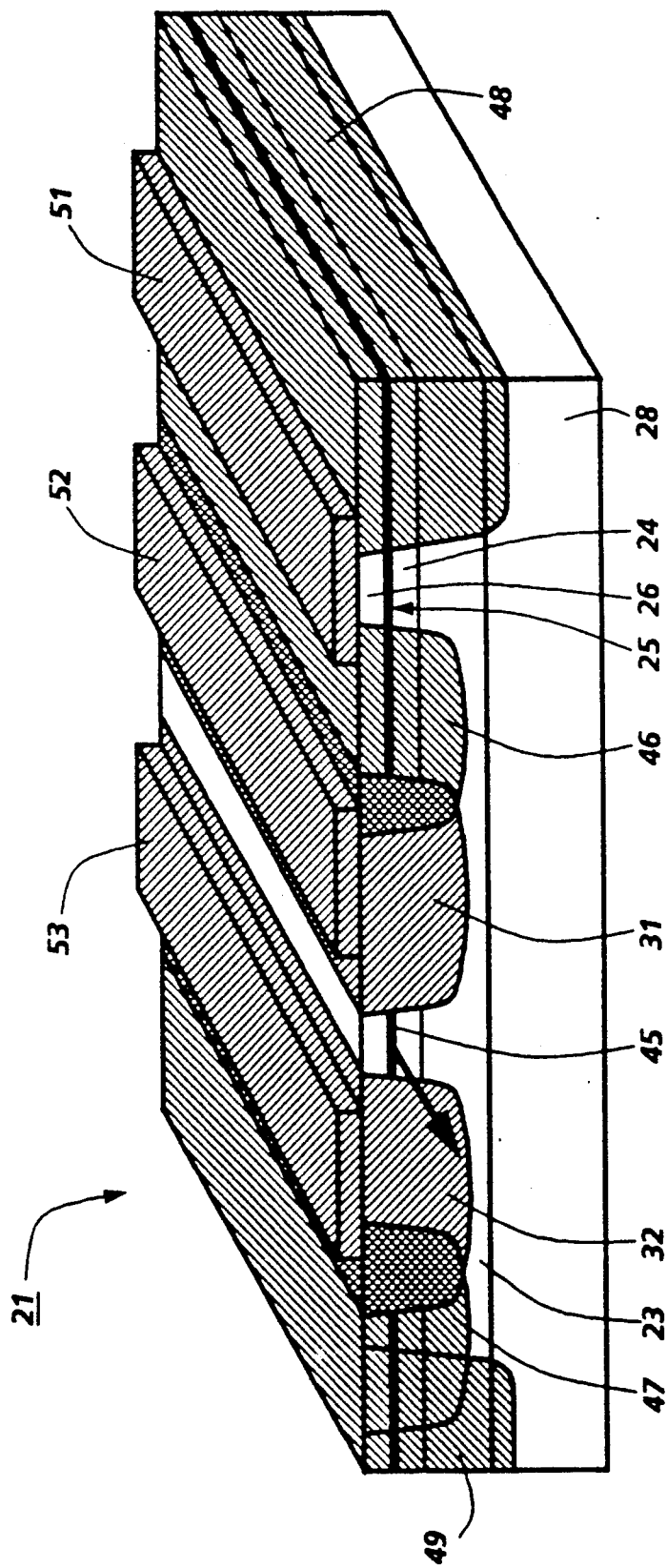
FIG. 1 is a sectioned isometric view of an AlGaAs surface skimming HTJ laser/L-HBT device constructed in accordance with the present invention.

Turning now to the drawings, and at this point especially to FIG. 1, there is an AlGaAs embodiment of a buried heterostructure compound semiconductor device 21 which can be biased to operate either as a surface skimming HTJ laser or as an L-HBT transistor. As will be seen, the HTJ laser and the L-HBT configurations of the device 21 are structurally consistent because they are fabricated in the same set of epitaxial layers 23–26 and have similar geometries. Moreover, they can be fabricated using similar processing steps, so they are well suited for optoelectronic integration.

More particularly, the multilayer heterostructure of the surface skimming HTJ laser/L-HBT transistor device 21 typically is grown on a p-type or semi-insulating substrate 28, suitably by employing a metalorganic chemical vapor deposition (MOCVD) process for sequentially growing a 0.2 μm or so thick GaAs buffer layer (not shown), a 1.0 μm thick layer 23 of $Al_mGa_{1-m}As$ (where m=the percentage of aluminum in the alloy), a 0.15 μm thick layer 24 of $Al_nGa_{1-n}As$ (where n=the percentage of aluminum in the alloy), a 0.015 thick layer 25 of GaAs (the active layer), and another 0.15 μm thick layer 26 of $Al_nGa_{1-n}As$. All epitaxial layers, except the GaAs active layer 25 in some situations, are doped with p-type impurities, such as magnesium; suitably to concentrations of approximately $1 \times 10^{18}$ Mg atoms/cm³ in the $Al_mGa_{1-m}As$ layer 23, $2 \times 10^{18}$ Mg atoms/cm³ in the lower $Al_nGa_{1-n}As$ layer 24, and $5 \times 10^{18}$ Mg atoms/cm³ in the upper $Al_nGa_{1-n}As$ layer 26. There are several options for achieving a p-type conductivity in the GaAs active layer 25, including some cases in which p-type impurities need not be directly introduced into that layer as it is being grown. For example, the active layer 25 may tend to acquire a p-type conductivity, without being directly doped, either as a result of the outdiffusion of p-type impurities into it from the adjacent doped layers 24 and 26 during any subsequent high temperature processing of the device 22 or as a result of the migration of holes into it from those adjacent layers 24 and 26.

The GaAs barrier layer is not shown because it merely functions as an oxygen getter layer for the MOCVD process to enhance the quality of the other epitaxial layers 23–26. The quality of the epitaxial layers 23–26 of the multilayer heterostructure is significant because they are functional components of the HTJ laser configuration of the device 21. Furthermore, the layers 24–26 also are integral components of its L-HBT configuration. Specifically, the $Al_mGa_{1-m}As$ layer 23 is the cladding for the lower waveguide layer 24 of the laser, and the layer 24 also is the lower burying layer for the transistor. The GaAs layer 25, in turn, functions as the active region of the laser and as the active base channel of the transistor device. Next comes the layer 26 which functions as the upper waveguide for the laser and as the upper burying layer for the transistor. As discussed in some additional detail hereinbelow, it is especially notable that the ambient 29 (typically air) is the cladding for the upper waveguide 26 of the laser configuration of the device 21 because this feature causes the waveguided modes of the laser to be asymmetrically distributed and, therefore, materially influenced by the selection of the alloy composition of the $Al_mGa_{1-m}As$ cladding layer 23 for the lower waveguide 24.

Referring to FIG. 2, the lateral heterojunctions of the surface skimming HTJ laser/L-HBT device 21 advantageously are formed by diffusions from the upper surface of its multilayer heterostructure. To that end, as shown, impurity induced disordering (IID) via silicon (Si) diffusion is utilized to convert laterally separated sections of the buried GaAs active layer 25 into n-type AlGaAs regions 31 and 32, thereby forming the collector and the emitter, respectively, of the L-HBT device and the quantum well of the HTJ laser. In keeping with the teachings of the aforementioned Thornton'648 patent and of the above-identified Thornton et al articles, such a IID process typically is carried out by first depositing a film of $Si_3N_4$ on the upper surface of the multilayer heterostructure, such as by chemical vapor deposition (CVD), and by then patterning the $Si_3N_4$ film to serve as a mask 41 for the diffusion of Si. Next, a bilayer film, which is composed of a thin layer of Si 42 capped by a thin layer of $Si_3N_4$ 44, is deposited, again suitably by CVD, to provide a source for the Si diffusion. Then, the diffusion is performed at 850° C. for about 1 hour to reach a depth of approximately 0.4 μm. In the regions where the Si diffusion front reaches the buried GaAs layer 25, the rate of interdiffusion of the GaAs layer 25 into the adjacent AlGaAs layers 24 and 26 is substantially increased, thereby forming a lateral n-p-n structure which has substantially higher alloy compositions (and, therefore, wider bandgaps) in its collector and emitter regions 31 and 32 than in its active base region or channel 45.

Following the formation of the lateral n-p-n heterostructure of the surface skimming HTJ laser/L-HBT device 21, hydrogen nuclei or the like are ion implanted into its epitaxial layers 23–26, as at 46–49. Implants 46 and 47 resistively desensitize the p-n junctions between the active base layer 25 and the outer sidewalls of the collector and emitter regions 31 and 32, respectively, by creating irregularities in the crystal structure in the vicinity of those junctions, thereby increasing their resistance sufficiently to inhibit the flow of current through them. To accomplish that, the implants 46 and 47 laterally overlap the outer margins of the collector and emitter regions 31 and 32, respectively, and penetrate into the lower epitaxial layer 23 to roughly the same depth as the collector and emitter regions 31 and 32. The implants 48 and 49, on the other hand, are located at the opposite lateral extremities of the device 21 and fully penetrate through all of its epitaxial layers 23 and 26 (and, if desired, even into its substrate 28) for electrically isolating the device 21 from any other devices (not shown) the substrate 28 supports, including any other devices which are fabricated using the same set of epitaxial layers 23-26. As shown, the implants 47 and 49 laterally overlap, but there is a lateral gap between the implants 46 and 48 so that an upper surface base contact 51 can be seated between them.

A patterned metallization, such as a Cr-Au metallization, typically is deposited on the upper surface of the device 21 to provide coplanar contacts 51-53 for making electrical connections to its base, collector and emitter 45, 31 and 32, respectively. In embodiments having a p-type substrate 28, the base 45 could be contacted from the substrate side of the device 21, but the upper surface base contact 51 is preferred because it simplifies the fabrication of the device 21, As illustrated, the device 21 has an asymmetric geometry because its base contact 51 is laterally offset from its n-p-n heterostructure. However, if a symmetric device geometry is desired, the base contact 51 may be relocated to a position mid-way between the collector contact 52 and the emitter contact 53. But, such a modification would inhibit the laser mode of operation of the device 21, unless the base contact 51 is composed of a material which is substantially non-absorbing to the wavelength of the fundamental emission of the laser.

As will be appreciated, the device 21 operates as a transistor when its collector/base junction is reversed biased and its emitter/base junction is forward biased. In that connection it should be noted that the relatively shallow depth at which the active base layer 25 of the device 21 is buried (e. g., in the embodiment illustrated in FIG. 1 it is buried at a depth of only 0.15 $\mu$m below the upper surface of the device 21) significantly reduces the width of the base channel 45 which can be reliably and repeatedly provided for the device 21 when, as here, its base channel width 45 is dependent upon a diffusion from its upper surface under the control of a mask which is defined by a photolithographic process of given minimum feature size. Moreover, the tapering of the Si diffusions which define the collector and emitter regions 31 and 32 of the device 21 is less pronounced near the upper surface of the device, so its lateral n-p-n heterostructure has relatively abrupt p-n junctions. Thus, the present invention can be employed for providing L-HBT devices having increased current gain and improved high frequency performance.

Figure 3:
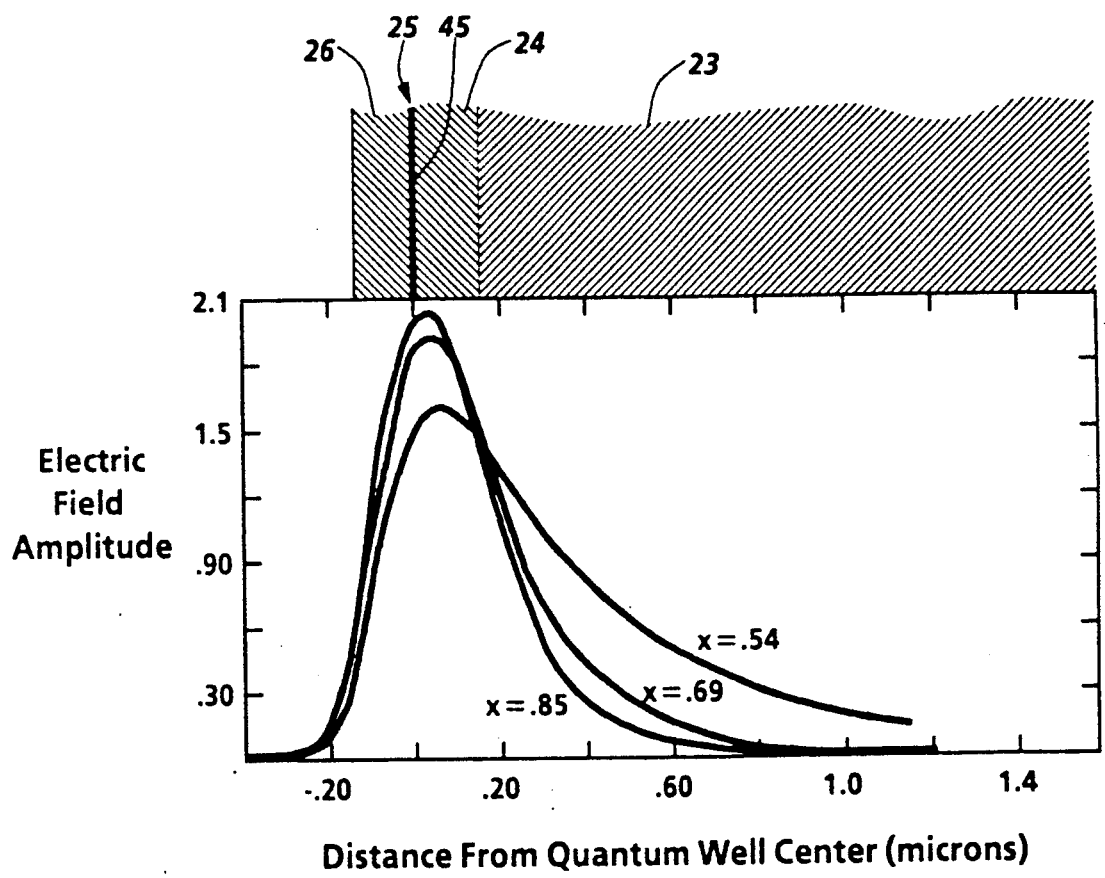
FIG. 3 graphically illustrates the manner in which the calculated electric field (i.e., "E-field") profile of the waveguided modes of a laser configuration of a device of the type shown in FIG. 1 varies as a function of the percentage of aluminum in the alloy composition of its lower cladding layer.

The device 21 operates as a single quantum well HTJ laser whenever its collector/base and emitter/base junctions are both forwardly biased sufficiently to cause the carrier density in its active base region 45 to build to a level at which stimulated emission is initiated. The lasing action occurs in the plane of the lateral n-p-n heterostructure of the device 21 along an axis which is normal to that structure (i.e., the lateral heterostructure defines the quantum well of the HTJ laser). As will be understood, the waveguide for the laser mode of operation of the device 21 is asymmetric because the interface between its upper waveguiding layer 26 and the ambient air is an integral part of the waveguide. Therefore, as shown in FIG. 3, the waveguided modes of the laser are asymmetrically distributed. However, in devices 21 employing more or less standard alloy compositions of $Al_{.4}Ga_{.6}As$ for the lower and upper waveguides 24 and 26, respectively, it has been found that this asymmetry is tolerable if the percentage of aluminum in the alloy composition of the $Al_mGa_{1-m}As$ cladding layer 23 for the lower waveguide is increased to a level above about 48%. If the percentage of aluminum in the lower cladding layer 23 is reduced significantly below that threshold level, the structure will become nonguiding. But, as shown in FIG. 3 and as indicated by the following table, the performance of the waveguide progressively improves as the percentage of aluminum in its lower cladding layer 23 is increased above the aforementioned threshold level: $\Gamma$ is the percentage of the optical power that is within the active region 45 and, therefore, is a key factor for calculating the threshold current required for lasing action in a given laser structure.

| Al Mole Fraction m | Refractive Index n | Overlap Factor $\Gamma$ |
| --- | --- | --- |
| 0.54 | 3.23 | 3.4% |
| 0.69 | 3.14 | 5.3% |
| 0.85 | 3.05 | 6.1% |

Accordingly, from a waveguiding point of view, the preferred alloy composition for the lower cladding layer 23 of the device 21 contains as much aluminum as possible consistent with maintaining its structural stability (this typically is a composition of approximately $Al_{.85}Ga_{.15}As$). In some situations, however, it may be desirable to reduce the percentage of aluminum in the lower cladding layer 23 somewhat in order to reduce the far field divergence of the laser emission.

If desired, the device 21 may be cleaved transversely with respect to its lateral n-p-n heterostructure to form a classical Fabry-Perot length cavity with reflective end mirrors or facets for providing the coherent positive optical feedback that is needed for its laser mode of operation. In that event, at least one of the end mirrors of the cleaved laser configuration of the device 21 may be partially transmissive for axially extracting output radiation, as at 51, from one or both ends of the laser.

Figure 4:
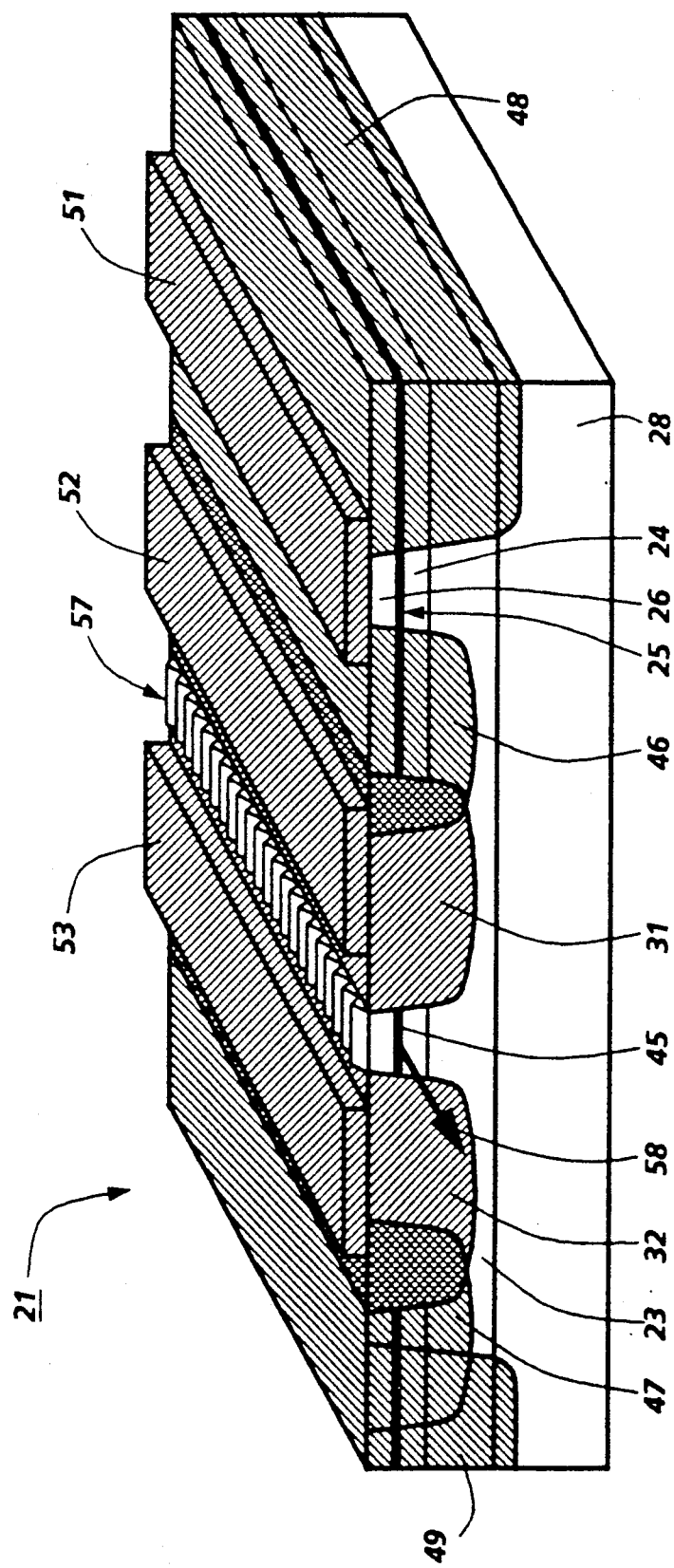
FIG. 4 is a sectioned isometric view of a surface skimming, distributed feedback (DFB), AlGaAs HTJ laser constructed in accordance with the present invention.

Alternatively, as shown in FIG. 4, a $n^{th}$ order diffraction grating 57 (i.e., a grating having a period of $n\lambda/2$, where n is an integer) may be formed on the outer surface of the upper layer 26 of the device 21 in vertically superimposed longitudinal alignment with its active region 45 for operating the device 21 as a distributed feedback (DFB) laser. As illustrated, the grating 57 extends from end-to-end of the active region 45 of the device 21, thereby enabling it to interact with the optical field at the surface of the device 21 along substantially the full length of its active region 45 to operate as a distributed Bragg reflector for providing coherent positive optical feedback for the DFB laser configuration of the device 21. The grating 57 typically is formed by etching the outer surface of the upper layer 26 of the device 21, but that does not interfere in any way with the important goal of avoiding the need for epitaxial regrowth. Since the optical feedback for the DFB laser configuration of the device 21 is provided by the grating 57, the laser cavity need not be terminated by reflective end mirrors, so one or both ends of the cavity may be transmissive to provide an axial output 58 for the laser radiation.

Figure 5:
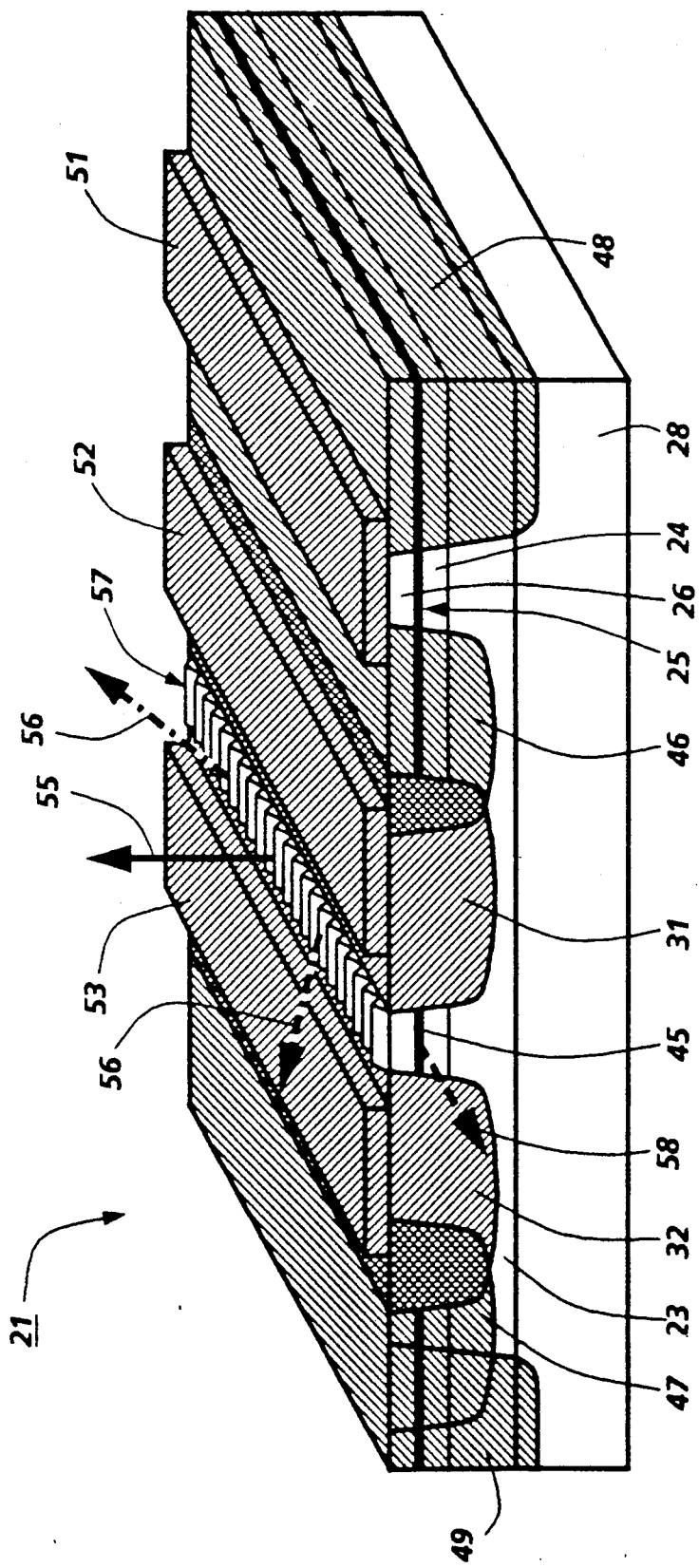
FIG. 5 is a sectioned isometric view of a surface emitting configuration of a DFB, surface skimming HTJ laser constructed in accordance with this invention.

As will be appreciated, certain orders of the diffraction grating 57 may couple a fraction of the fundamental frequency power of the DFB laser configuration of the device 21 out of the upper surface of the device 21 at predetermined angles. The order of the grating 57 relative to the fundamental frequency at which the device 21 lases determines the fraction of the fundamental power which is "surface emitted" and the angles at which these diffracted beams are emitted. One of the more interesting applications of this "surface emitting" DFB laser configuration of the device 21 is illustrated in FIG. 5 where the grating 57 is a second order grating for emitting, as at 55, the fundamental lasing frequency at a near normal angle with respect the active region 45 of the device 21. The normal or near normal surface emission from the device 21 is highly desirable for applications in which design considerations dictate against the use of an edge emitting laser configuration for extracting optical power from the device 21.

As a result of the high optical field intensity in the laser cavity of the device 21, the non-linearity of the semiconductor materials within its waveguiding structure 23-26 causes measurable amounts of second harmonic optical generation. See, for example, Ogasawara et al., "Second Harmonic Generation in an AlGaAs Double-Heterostructure Laser", *Japanese Journal of Applied Physics*, Vol. 26, No. 8, August 1987, pp. 1386-1387. This second harmonic light is of significant interest because it falls within the visible region of the emission spectrum—e.g., at a blue wavelength of 435 nm. if the wavelength of the fundamental laser emission is 870 nm. Unfortunately, this second harmonic energy is strongly absorbed by the materials in which it is generated, so it typically is absorbed after traveling only several hundred angstroms.

Turning again to FIG. 5, it will be seen that the grating 57 of the DFB surface emitting laser configuration of the device 21 also is an improved means for extracting the internally generated second harmonic light. The grating 52 diffracts out the second harmonic light at angles determined by the wavelength of that harmonic. Since the extraction occurs along the entire length of the laser cavity, the full length of the laser contributes to the second harmonic emission, rather than only the last several hundred angstroms of the cavity near one of its ends.

Figure 6:
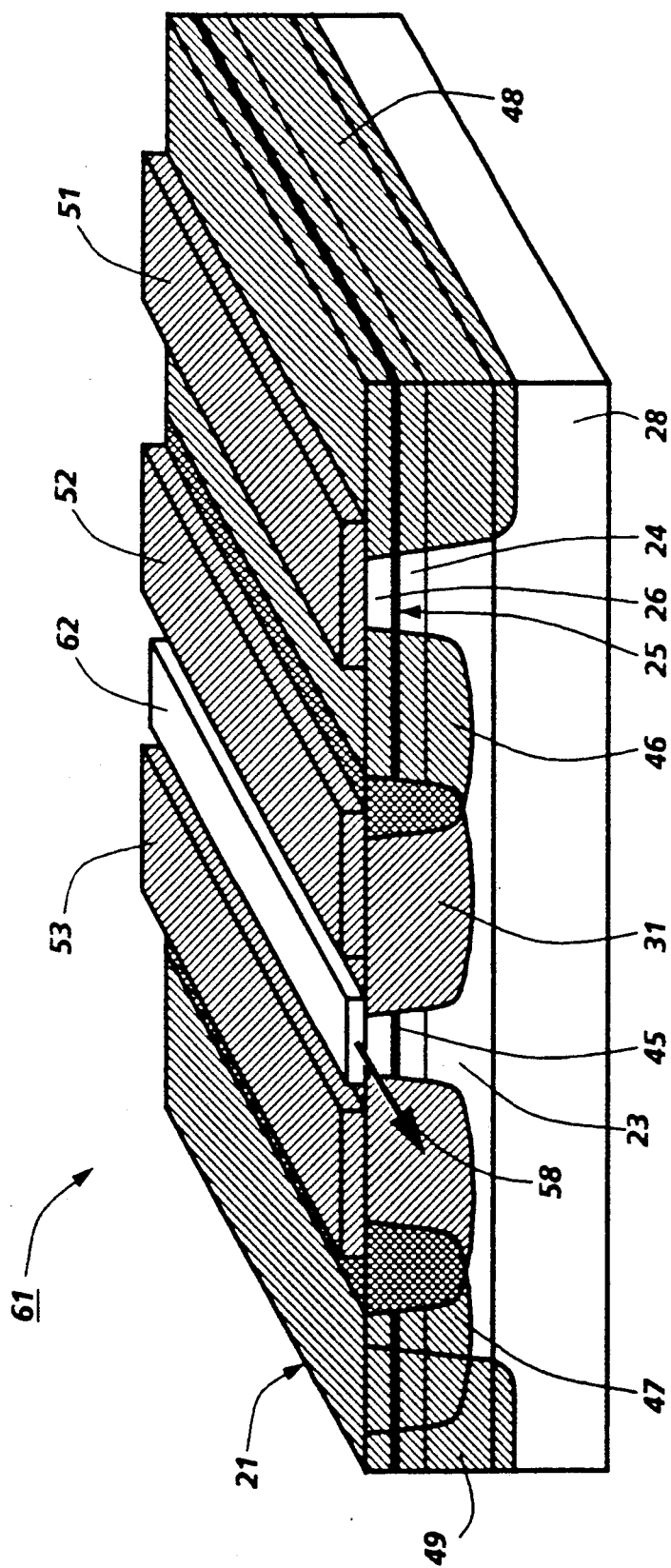
FIG. 6 is a sectioned isometric view of an optical harmonic generator embodying a surface skimming AlGaAs HTJ laser constructed in accordance with this invention.

Referring to FIG. 6, even further improvements in the extraction of the second harmonic light from the laser cavity of the device 21 may be realized by exposing materials having strong non-linear properties and/or superior optical transmission characteristics at the harmonic frequency to the optical field at the outer surface of its upper epitaxial layer 26. For example, to employ the Fabry-Perot cavity laser configuration of the device 21 as a driver for an enhanced optical harmonic generator 61, a film 62 composed of a suitable non-linear material, such as KDP, $LiNbO_2$ or Langmuir-Blodgett layers, may be deposited on the outer surface of the upper epitaxial layer 26 of the device 21 in vertically superimposed longitudinal alignment with its active region 45, thereby exposing the full length of the film 62 to the surface skimming portion of the optical field produced by the laser. Even more generally, it will be evident that the surface skimming laser which this invention provides lends itself to most any application in which it is desired to expose external means, such as generating means or sensing means, to the electric field of the waveguided modes of the laser.

Figure 7:
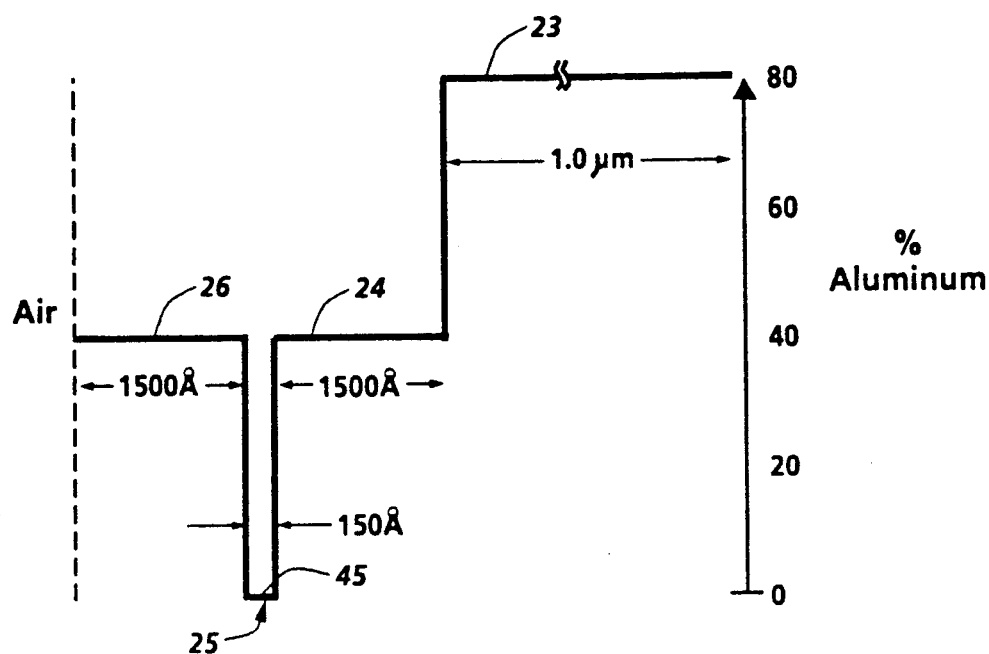
FIG. 7 is a graphical representation of the multilayer epitaxial heterostructure of the single base channel L-HBT transistor/single quantum well surface skimming HJT laser embodiment of this invention that is shown in various forms in FIGS. 1 and 4–6.
Figure 8:
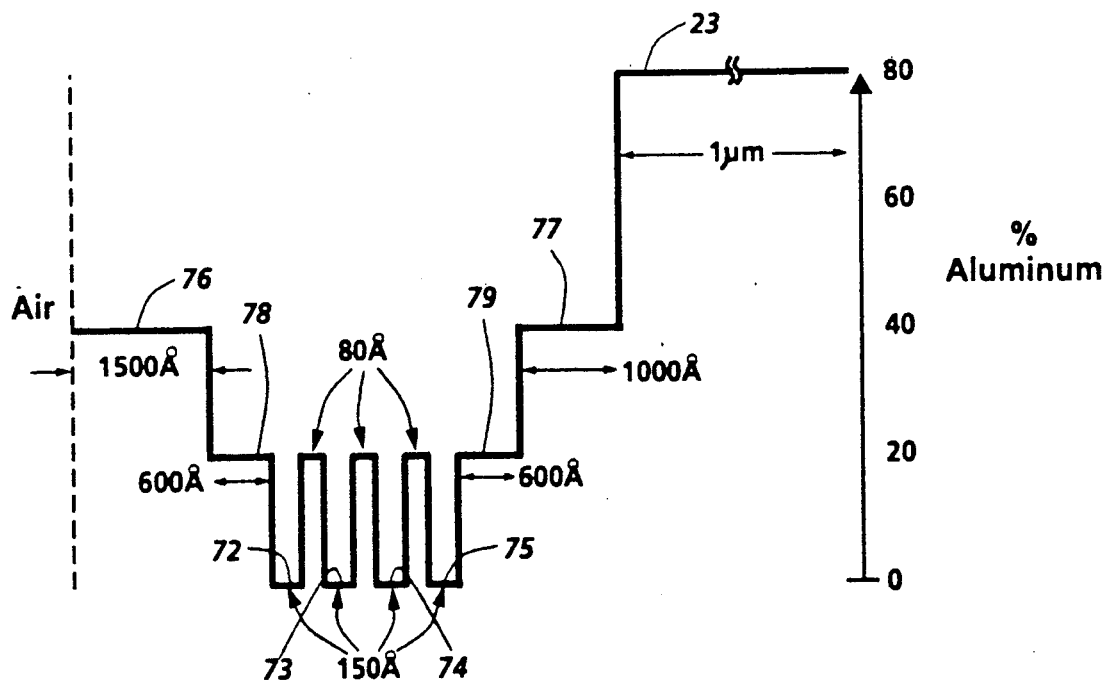
FIG. 8 graphically represents the multilayer epitaxial heterostructure of a multiple base channel L-HBT transistor/multiple quantum well surface skimming HTJ laser embodiment of the present invention.

FIG. 7 diagrammatically illustrates the multilayer heterostructure of the above-described single channel L-HBT/ single quantum well surface skimming HTJ laser 21 as a function of the percentage of aluminum in each of its epitaxial layers 23-26. FIG. 8 is a similar diagram for an extension of the present invention into the realm of multiple channel L-HBT's/multiple quantum well HTJ lasers. More particularly, FIG. 8 illustrates the multilayer epitaxial heterostructure of a device 71 having four active layers 72-75 which are buried at depths ranging from about 0.21 $\mu$m to about 0.28 $\mu$m below its outer surface. The upper and lower 40% aluminum burying layers 76 and 77 of the device 71 are separated from its upper and lower active layers 72 and 75 by intermediate layers 78 and 79, respectively, which are composed of an $Al_{.2}Ga_{.8}As$ alloy. Likewise, the same $Al_{.2}Ga_{.8}As$ alloy is used for the barrier layers 81-83 between the active regions 72-75. As before, the 40% aluminum upper burying layer 76 suppresses surface recombination effects. so the 40% aluminum lower burying layer 77 is employed to provide a reasonably well balanced waveguide for the HTJ laser configurations of the device 71. Now, however, the burying layers 76 and 77 are separated from the active layers 72-75 by the intermediate 20% aluminum layers 78 and 79 to prevent deep level defects, such as the DX center, from degrading the device performance.

Figure 9:
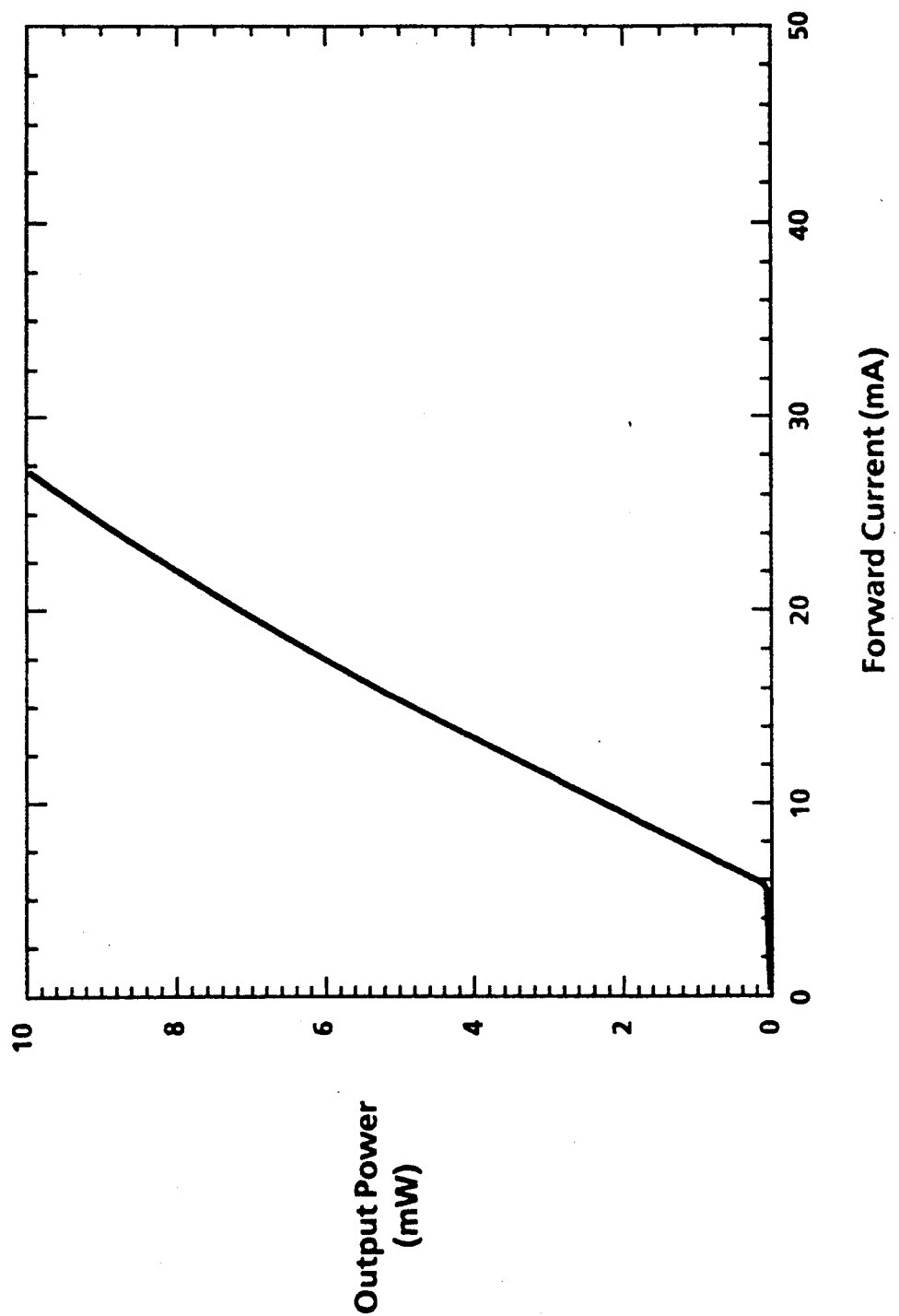
FIG. 9 is a characteristic output power vs. input current curve for a multiple quantum well surface skimming HTJ laser fabricated in accordance with this invention in the epitaxial layers depicted in FIG. 8.
Figure 10:
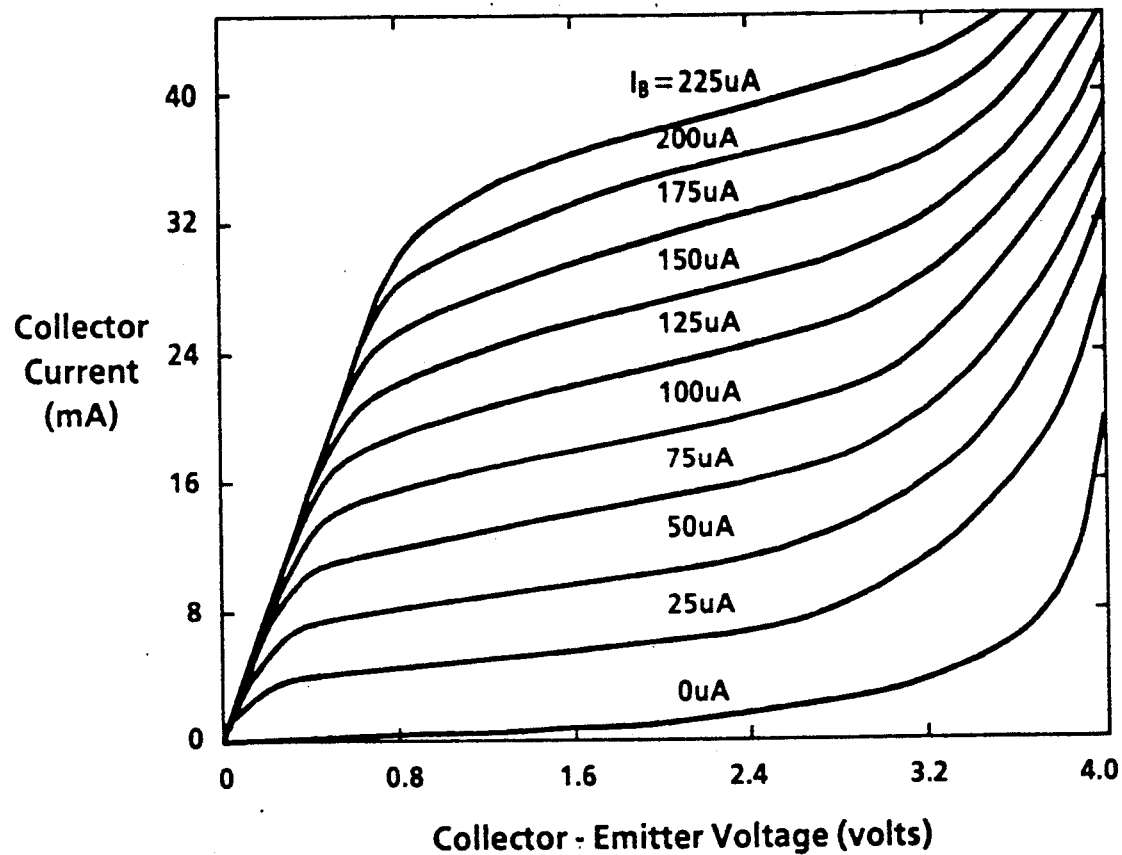
FIG. 10 shows the characteristic current vs. voltage curves for a multiple channel L-HBT transistor fabricated in the epitaxial layers depicted in FIG. 8.

FIG. 9 is an input current vs. output power curve for a typical surface skimming multiple quantum well HTJ laser fabricated in the epitaxial layers depicted in FIG. 8, while FIG. 10 illustrates the collector current vs collector-emitter voltage curves for a L-HBT transistor device fabricated in the same set of epitaxial layers. As will be seen, it was found that the HTJ laser operated with a forward current threshold of about 5.9 ma for the onset of lasing and had a slope efficiency of approximately 0.5 m W/ma. The L-HBT transistor, on the other hand, was found to have current gains in excess of 200 for collector currents in the range of the threshold current of the laser. Accordingly, it will be evident that the laser and transistor configurations of the particular set of epitaxial layers shown in FIG. 8 are very well matched for integrated optoelectronic applications.

What is claimed:

1. A multilayer compound semiconductor heterostructure device for the fabrication of lateral heterojunction bipolar transistors and hetero-transverse junction lasers; said heterostructure including at least one active layer disposed between an upper layer and a lower layer, and means for laterally injecting current into said active layer; said upper layer having an upper surface that defines an upper extremity of said heterostructure and having a thickness selected to cause lasing within said active layer to produce an optical field of substantial intensity at said upper surface.

2. The multilayer heterostructure of claim 1 wherein said active layer is buried by said upper layer at a depth of less than about 0.4 $\mu$m below said upper surface.

3. A surface skimming hetero-transverse junction compound semiconductor laser device comprising
an upper waveguiding layer having an outer surface that is optically interfaced with an external ambient,
a lower waveguiding layer, and
at least one active layer disposed between said upper waveguiding layer and said lower waveguiding layer at a depth which is sufficiently shallow to cause waveguided modes of said laser to have significant optical intensity at said interface.

4. The surface skimming hetero-transverse junction compound semiconductor laser device of claim 3 further including a periodic n$^{th}$ order diffraction grating located on the outer surface of said upper waveguiding layer, said diffraction grating overlying an active region of said laser and extending lengthwise thereof for providing distributed optical feedback for said laser.

5. The laser of claim 3 further including
means for extracting optical power from said laser via said diffraction grating.

6. The laser of claim 5 wherein
said diffraction grating is a second order grating for diffracting fundamental frequency optical power out of said laser at a near normal angle with respect to said active layer.

7. The laser of claim 5 wherein
said diffraction grating diffracts second harmonic optical power out of said laser at a predetermined angle along essentially the full length of said active region.

8. The laser of claim 3 further including
a film of strongly non-linear material deposited on the outer surface of said upper cladding layer in overlying axial alignment with an active region of said laser, said laser having a predetermined fundamental lasing frequency for causing said film to emit light at a second harmonic of said frequency.

9. A surface skimming hetero-transverse junction compound semiconductor laser device comprising
an upper waveguiding layer having an outer surface which participates in guiding waveguided modes of said laser,
a lower waveguiding layer, and
at least one active layer disposed between said upper waveguiding layer and said lower waveguiding layer;
said outer surface of said waveguide being perturbed to exert a predetermined influence on said waveguided modes of said laser.

10. A surface skimming hetero-transverse junction compound semiconductor laser device comprising
an upper waveguiding layer having an outer surface which participates in guiding waveguided modes of said laser,
a lower waveguiding layer, and
at least one active layer disposed between said upper waveguiding layer and said lower waveguiding layer;
means adjacent said outer surface of said upper waveguiding layer of said laser for optically interacting with said waveguided modes of said laser.

11. The device of any one of claims 1–10 wherein
said device is composed of GaAs and AlGaAs compound semiconductor alloys.

* * * * *